United States Patent [19]

Lee

[11] Patent Number: 4,757,197

[45] Date of Patent: Jul. 12, 1988

[54] SEMICONDUCTOR LASER AND DETECTOR DEVICE

[76] Inventor: Wai-Hon Lee, 10332 Noel Ave., Cupertino, Calif. 95014

[21] Appl. No.: 858,411

[22] Filed: May 1, 1986

[51] Int. Cl.⁴ .............................................. H01J 5/02
[52] U.S. Cl. ...................................... 250/239; 357/19
[58] Field of Search .................. 357/19; 250/551, 239, 250/211 R, 211 J

[56] References Cited

U.S. PATENT DOCUMENTS

| | | | |
|---|---|---|---|
| 4,124,860 | 11/1978 | Johnson | 357/19 |
| 4,307,297 | 12/1981 | Groff et al. | 250/551 |
| 4,351,051 | 9/1982 | Van Alem et al. | 357/19 |
| 4,607,368 | 8/1986 | Hori | 357/19 |
| 4,624,526 | 11/1986 | Tsukai et al. | 350/3.72 |

FOREIGN PATENT DOCUMENTS

| | | | |
|---|---|---|---|
| 207789 | 3/1984 | Fed. Rep. of Germany | 357/19 |
| 0199573 | 11/1983 | Japan | 357/19 |

Primary Examiner—David C. Nelms
Attorney, Agent, or Firm—Townsend & Townsend

[57] ABSTRACT

A combined semiconductor laser and photodetector with a photodetector arranged to directly monitor light reflected off an object surface from the semiconductor laser. A photodetector is mounted in the same plane as the surface of the semiconductor laser which emits light. This plane is substantially perpendicular to the central axis of the cone of light emitted from the semiconductor laser. The photodetector and the semiconductor laser are both mounted within a single housing.

13 Claims, 7 Drawing Sheets

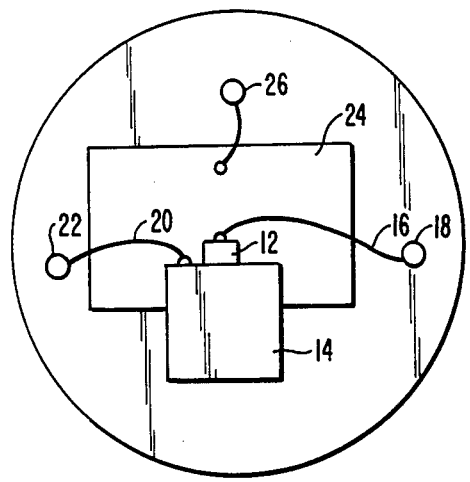
FIG._1. PRIOR ART
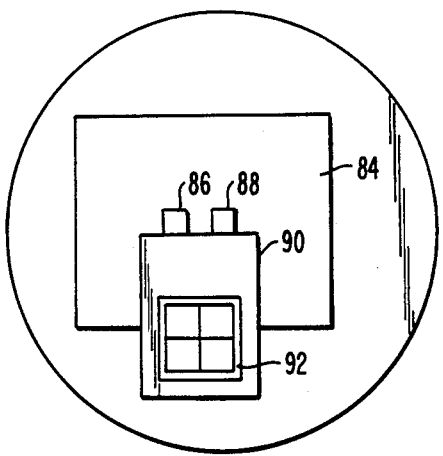
FIG._6.
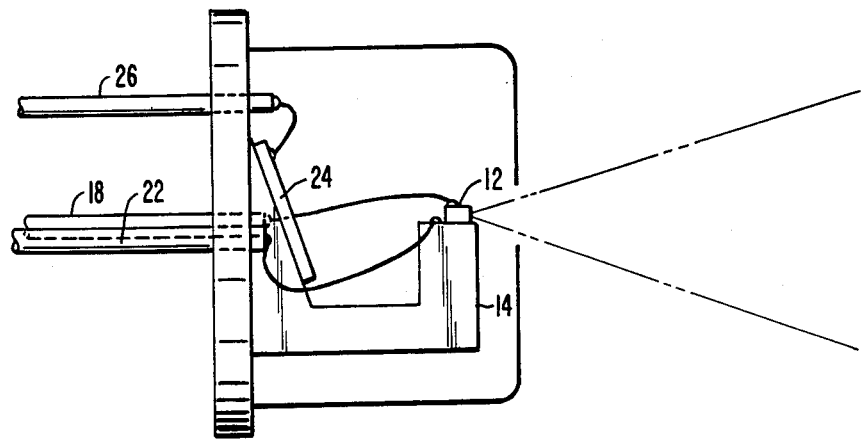
FIG._2. PRIOR ART
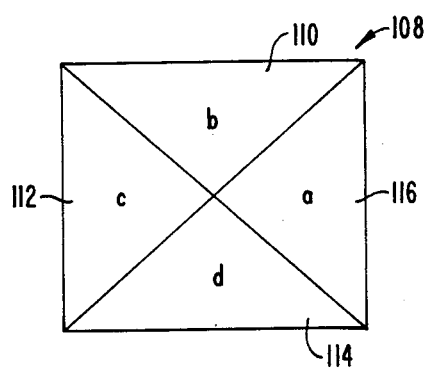
FIG._8(a).
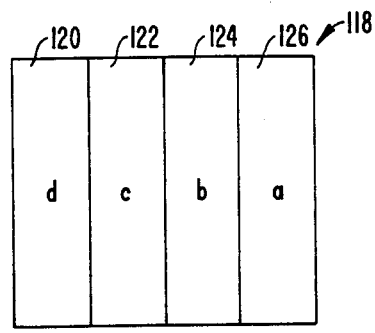
FIG._8(b).

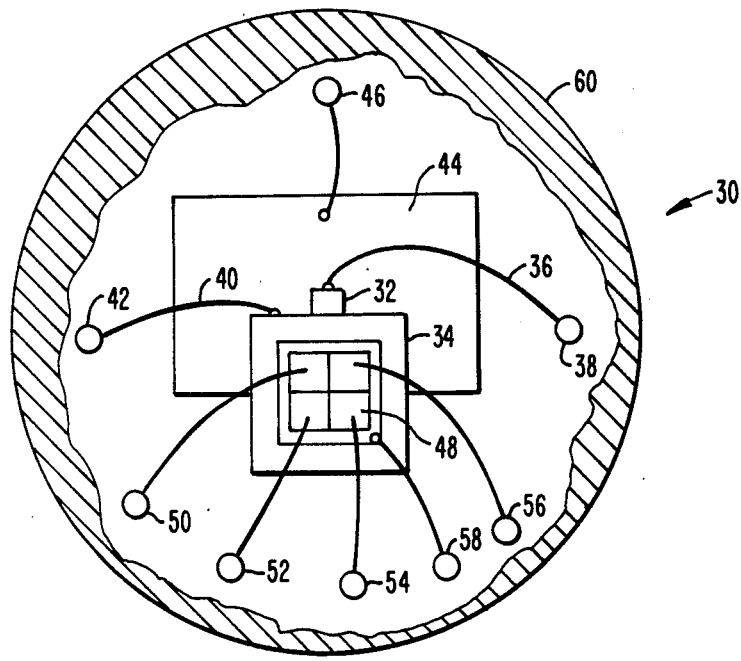
FIG._3.
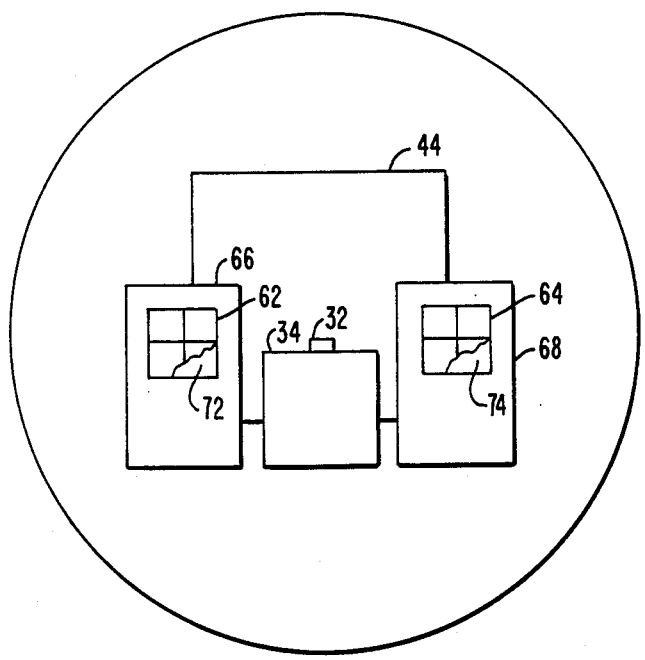
FIG._4.

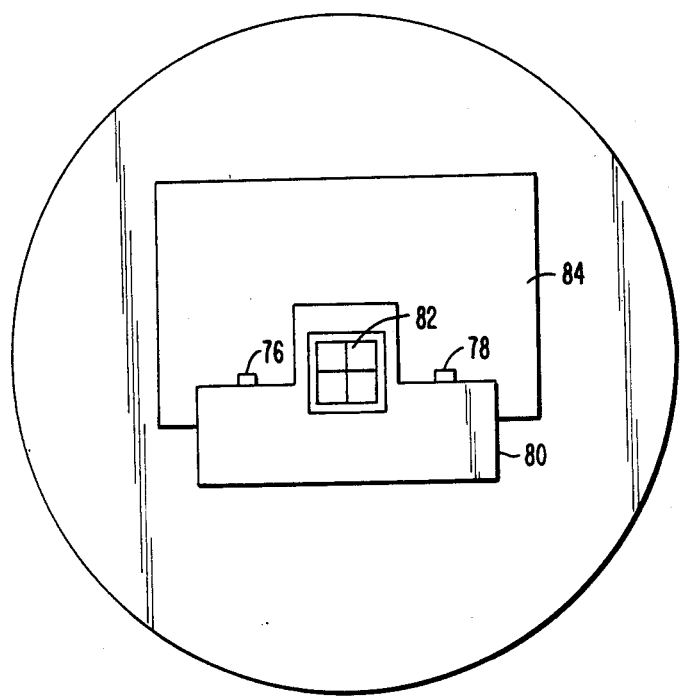
FIG._5.
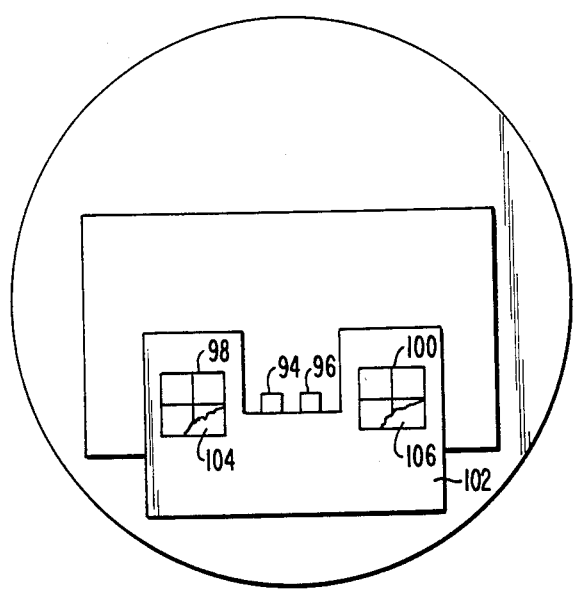
FIG._7.

SEMICONDUCTOR LASER AND DETECTOR DEVICE

BACKGROUND

The present invention relates to semiconductor lasers and detectors for detecting light from a semiconductor laser.

A semiconductor laser is a device which emits light of substantially a single wavelength. The light from this type of laser can be focused to a spot with a diameter comparable to its wavelength. The semiconductor laser belongs to the same family of semiconductor devices as the LED (light emitting diode). However, the light from an LED has a broader spectrum of wavelengths and thus cannot be focused as sharply as a semiconductor laser. The structure and composition of the laser determine its wavelength, its expected lifetime and its light guiding mechanism. Examples of laser structures are gain guided lasers and index guided lasers. Examples of laser structures are shown in U.S. Pat. Nos. 3,479,613, 3,457,468, 3,293,513, 3,257,626, and 4,483,480.

Most commercial semiconductor lasers contain a photodetector behind the lasing structure to monitor the level of light emitted at the front of the laser chip. The monitoring photodetector provides a signal which is used to maintain a constant laser output. It has been noted in some applications that when a small amount of light emitted from the laser is fed back into the laser chip, it causes a change in the laser output power which can be detected by the rear photodetector. Otherwise, most applications use a separate photodetector to monitor light reflected off of an object by a laser. This light is typically supplied to the separate photodetector through a beam splitter or other device.

FIGS. 1 and 2 show front and side views, respectively, of a typical prior art laser. A semiconductor laser diode chip 12 is mounted on a heat sink 14. A wire 16 is coupled to the top of the semiconductor chip 12 which forms the anode of the laser diode. Wire 16 is coupled to a pin 18. A wire 20 is coupled to either heat sink 14 or another contact which constitutes the cathode of the laser diode. Wire 20 is coupled to a pin 22. A photodetector 24 is coupled to a pin 26. This provides a three pin laser diode which is typically packaged in a standard transistor TO5 can. Photodetector 24 is slightly tilted as shown in the side view of FIG. 2. This tilt of photodetector 24 is provided to prevent light which is reflected off of the photodetector from being fed back into laser chip 12.

SUMMARY OF THE INVENTION

The present invention is a combined semiconductor laser and photodetector with a photodetector arranged to directly monitor light reflected off an object surface from the semiconductor laser. A photodetector is mounted in the same plane as the surface of the semiconductor laser which emits light. This plane is substantially perpendicular to the central axis of the cone of light emitted from the semiconductor laser. The photodetector and the semiconductor laser are both mounted within a single housing.

Preferably, the semiconductor laser chip is mounted on the top of a heat sink, with the photodetector being mounted on a front surface of the heat sink such that it is aligned with a front surface of the semiconductor laser chip. In one embodiment, the photodetector is a four quadrant photodetector so that it can independently detect light in each of four quadrants.

By utilizing differential detection with a four quadrant photodetector (or another arrangement of a plurality of photodetectors), the signal of interest is the difference between the signals detected by the four photodetectors. This difference signal is further normalized by a sum signal from the four quadrants. For example, if a, b, c and d are signals from each quadrant, the signal of interest is:

$$\frac{[(a+b)-(c+d)]}{a+b+c+d} \text{ or: } \frac{(a+d)-(b+c)}{a+b+c+d}$$

Thus, the photodetector is not sensitive to variations in gain caused by temperature variations by virtue of mounting the laser diode on the same heat sink as the photodetectors. The use of the four quadrant photodetector enables this embodiment of the present invention to combine the laser diode and the four quadrant photodetector on the same heat sink. The present invention also preferably uses a different container than the standard TO5 can, thus allowing the use of a larger heat sink or the use of multiple heat sinks.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a front view of a prior art laser diode;

FIG. 2 is a side view of the laser diode of FIG. 1;

FIG. 3 is a front view of a first preferred embodiment of a semiconductor laser and detector according to the present invention;

FIG. 4 is a front view of a second preferred embodiment of a laser diode and detector according to the present invention;

FIG. 5 is a front view of a third preferred embodiment of a semiconductor laser and photodetector according to the present invention;

FIG. 6 is a front view of a fourth preferred embodiment of a semiconductor laser and photodetector according to the present invention;

FIG. 7 is a fifth preferred embodiment of a semiconductor laser and photodetector according to the present invention; and FIGS. 8A and 8B are diagrams of alternate configurations of a four quadrant photodetector according to the present invention.

DETAILED DESCRIPTION OF THE PREFERRED EMBODIMENTS

FIG. 3 is a front view of a semiconductor laser and photodetector 30 according to the present invention. A semiconductor laser diode 32 is mounted on a heat sink 34. A wire 36 coupled to the top, or anode, of semiconductor laser 32 is coupled to an output pin 38. A wire 40 is coupled to heat sink 34 to provide a connection to the cathode of the semiconductor laser and is in turn coupled to an output pin 42. A rear photodetector 44 is coupled to an output pin 46. Photodetector 44 is slightly tilted in the same manner as photodetector 24 of FIGS. 1 and 2.

A four quadrant photodetector 48 is mounted on the face of heat sink 34. The four quadrants are respectively coupled to output pins 50, 52, 54 and 56. A common contact of each of the four photodetectors 48 is coupled to an output pin 58.

Preferably, photodetector 48 is coupled to heat sink 34 with an isolating epoxy or glue. The centerline of four quadrant photodetector 48 is lined up with a vertical line running through the center of semiconductor laser 32. A single housing 60 encloses both semiconductor laser diode 32 and photodetector 48.

Photodetector 48 should be within the same plane as the forward surface of semiconductor laser 32, or at least within the depth of focus of that surface. When the laser is used in an application, the light emitted from the laser is in the form of a cone which is emitted from both the front and back of the semiconductor laser. Typically, this cone will have an angle of approximately 33° in one dimension and an angle of approximately 10° in the other direction, resulting in an elliptical beam. A lens can be used to collimate this beam (produce a parallel beam of light). The reflected beam will also pass through a lens and be focused on photodetector 48. The depth of focus determines the amount of allowable error in the alignment of the photodetector and the laser diode. The depth of focus is proportional to the wavelength divided by the square of the numerical aperture of the lens. For many applications, this depth of focus, for a numerical aperture of about 0.1, will be within the range of approximately 50 microns.

The pin out configuration shown in FIG. 3 can be varied and the housing 60 can be either a power transistor can or any other device. The pin outs could also be varied as desired.

FIG. 4 shows a front view of a second embodiment of a semiconductor laser and photodetector according to the present invention. As in the embodiment of FIG. 3, a semiconductor laser 32 is mounted on a heat sink 34 and a rear photodetector 44 is provided. However, two four-quadrant photodetectors 62 and 64 are employed. Photodetectors 62 and 64 are mounted on heat sinks 66 and 68, respectively. Alternately, a single heat sink combining heat sinks 34, 66 and 68 could be used. The advantage of this configuration is that more reflected light can be detected by the utilization of the two photodetectors 62 and 64 which would detect light reflected to either side of semiconductor laser 32. Photodetectors 62 and 64 can optionally be covered by polarization analyzing elements 72 and 74, respectively. Polarization analyzing elements 72 and 74 are shown partially broken away and could cover all or a portion of photodetectors 62 and 64.

Another embodiment of the present invention is shown in FIG. 5. Here, a pair of semiconductor lasers 76 and 78 are used and are mounted on a common heat sink 80. A four quadrant photodetector 82 is mounted between the two semiconductor lasers 76 and 78 on common heat sink 80. Again, as in FIG. 1, a rear photodetector 84 is used. The advantage of this configuration is that one laser diode can act as a backup to the other in the event of failure.

FIG. 6 shows yet another embodiment of the present invention. Here, a pair of semiconductor lasers 86 and 88 are mounted on the top of a common heat sink 90. A four quadrant photodetector 92 is mounted on the face of heat sink 90 below semiconductor lasers 86 and 88. The centerline of photodetector 92 coincides with the centerline between the two semiconductor lasers 86 and 88. Preferably, the center of photodetector 92 is less than one millimeter from semiconductor lasers 86 and 88. Thus, due to the small separation of the semiconductor lasers 86 and 88, the difference in alignment of the semiconductor lasers with respect to the detector is not significant.

Yet another embodiment utilizing two semiconductor lasers 94 and 96 and two four quadrant photodetectors 98 and 100 is shown in FIG. 7. The semiconductor lasers and the photodetectors are all mounted on a common heat sink 102. Again, as in FIG. 4, photodetectors 98 and 100 can be covered partially or wholly by polarization analyzing elements 104 and 106, respectively. This enables the photodetectors to detect a change in polarization of a reflected beam from semiconductor lasers 94 and 96.

FIG. 8A shows an alternate embodiment of a four quadrant photodetector 108 which has four triangular photodetectors 110, 112, 114 and 116. The four photodetectors could also be any other shape and arranged in four quadrants other than the triangular shape of this figure or the rectangular shape shown in the preceding figures. Alternately, a number of photodetectors in parallel could be used as shown in FIG. 8B. Here, a photodetector 118 has four parallel photodetectors 120, 122, 124 and 126. The number and positioning of the photodetectors depends upon the optical system employed. An optical head utilizing the semiconductor laser and photodetector apparatus according to the present invention is shown in my copending application entitled, "Improved Optical Head," Ser. No. 06/860,154, filed May 6, 1986.

As will be understood by those familiar with the art, the present invention may be embodied in other specific forms without departing from the spirit or essential characteristics thereof. For example, a pair of photodetectors or three photodetectors could be used in place of the four quadrant photodetector shown in the figures. Accordingly, the disclosure of the preferred embodiments of the present invention is intended to be illustrative, but not limiting, of the scope of the invention which is set forth in the following claims.

What is claimed is:

1. A laser emission and detection device capable of directing a laser beam at a remote surface and detecting a reflection of said beam, comprising:

a semiconductor laser having a first, forward light-emitting surface;

detector means having at least two detectors for enabling the sensing of the shape of said reflected laser beam from the difference in the amount of said reflected laser beam detected by each of said two detectors, said detector means being mechanically coupled to said semiconductor laser in substantially the same plane as or in front of said first surface within a depth of focus of said semiconductor laser, said plane being substantially perpendicular to an optical axis of said laser beam emitted from said laser;

a common heat sink, both said laser and said detector means being mounted on said heat sink; and a single housing enclosing both said laser and said detector means.

2. The device of claim 1 wherein said detector means is within five millimeters of said semiconductor laser.

3. The device of claim 1 wherein said detector means is mounted to said heat sink below said laser in a location such that a vertical line substantially intersects a center of said laser and a center of said detector means.

4. The device of claim 1 wherein said detector means comprises four independent photodetectors, each of said photodetectors being in a different quadrant.

5. The device of claim 1 wherein said detector means comprises a plurality of independent photodetectors arranged side by side in a row.

6. The device of claim 1 further comprising a second detector means for sensing light located behind said semiconductor laser.

7. The device of claim 1 further comprising a second detector means for sensing light mechanically coupled to said semiconductor laser substantially in said plane, said first mentioned and second detector means being on opposite sides of said semiconductor laser.

8. The device of claim 7 further comprising first and second polarizers covering at least a portion of said first and second detector means, respectively.

9. The device of claim 7 further comprising a second semiconductor laser mechanically coupled to said first-mentioned semiconductor laser within said housing.

10. The device of claim 1 further comprising a second semiconductor laser mechanically coupled to said first-mentioned semiconductor laser within said housing.

11. A laser emission and detection device capable of directing a laser beam at a remote surface and detecting a reflection of said beam, comprising:
 a semiconductor laser having a first, forward light-emitting surface;
 a heat sink having a top surface supporting said semiconductor laser and a front surface in substantially the same plane as said first surface of said laser;
 four photodetectors for enabling the detection of the shape of said reflection of said beam from the difference in the amount of said reflection of said beam detected by each of said photodetectors, said photodetectors being mounted to said front surface of said heat sink, each of said photodetectors being in a different quadrant;
 detector means located behind said semiconductor laser for detecting a rear emission of a laser beam from said laser; and
 a single housing enclosing said laser, said heat sink, said four photodetectors and said detector means.

12. A laser emission and detection device capable of directing a laser beam at a remote surface and detecting a reflection of said beam, comprising:
 a semiconductor laser having a first, forward light-emitting surface;
 first and second photodetectors for enabling the detection of the shape of said reflection of said beam from the difference in the amount of said reflection of said beam detected by each of said photodetectors, said photodetectors being mechanically coupled to said semiconductor laser in substantially the same plane as or in front of said first surface within a depth of focus of said semiconductor laser, said plane being substantially perpendicular to an optical axis of said laser beam emitted from said laser;
 first and second polarization analyzing elements covering at least a portion of said first and second detector means, respectively, for detecting a change in the polarization of said reflection of said laser beam;
 a common heat sink, both said laser and said photodetectors being mounted on said heat sink; and
 a single housing enclosing both said laser and said first and second photodetectors.

13. A laser emission and detection device capable of directing a laser beam at a remote surface and detecting a reflection of said beam, comprising:
 a semiconductor laser having a first, forward light-emitting surface;
 a plurality of independent photodetectors arranged side by side in a row for enabling the detection of the shape of said reflection of said beam from the difference in the amount of said reflection of said beam detected by each of said photodetectors, said photodetectors being in substantially the same plane as or in front of said first surface within a depth of focus of said semiconoductor laser, said plane being substantially perpendicular to an optical axis of said laser beam emitted from said laser;
 a common heat sink, both said laser and said photodetectors being mounted on said heat sink; and
 a single housing enclosing both said laser and said photodetectors.

* * * * *